United States Patent
Senoo et al.

(10) Patent No.: US 9,064,580 B2
(45) Date of Patent: Jun. 23, 2015

(54) NONVOLATILE SEMICONDUCTOR MEMORY DEVICE AND WRITE-IN METHOD THEREOF

(75) Inventors: Makoto Senoo, Tokyo (JP); Hideki Arakawa, Hsin-Chu (TW); Riichiro Shirota, Tokyo (JP)

(73) Assignee: Powerchip Technology Corporation, Hsin-Chu (TW)

( * ) Notice: Subject to any disclaimer, the term of this patent is extended or adjusted under 35 U.S.C. 154(b) by 327 days.

(21) Appl. No.: 13/527,251

(22) Filed: Jun. 19, 2012

(65) Prior Publication Data
US 2013/0176783 A1    Jul. 11, 2013

(30) Foreign Application Priority Data

Jan. 6, 2012  (JP) ................. 2012-001495

(51) Int. Cl.
G11C 16/06 (2006.01)
G11C 16/10 (2006.01)
G11C 16/20 (2006.01)

(52) U.S. Cl.
CPC ............. *G11C 16/10* (2013.01); *G11C 16/20* (2013.01)

(58) Field of Classification Search
CPC ................................ G11C 16/10; G11C 16/20
USPC ............................ 365/185.09, 185.23, 185.29
See application file for complete search history.

(56) References Cited

U.S. PATENT DOCUMENTS 7,652,928 B2    1/2010  Yanagidaira et al.
7,800,946 B2    9/2010  Kim et al.
7,881,110 B2    2/2011  Park
8,050,097 B2 *  11/2011 Wang ................. 365/185.18
2008/0062770 A1 * 3/2008 Tu et al. ............. 365/185.28
2008/0158979 A1   7/2008 Kamei et al.
2010/0195400 A1 * 8/2010 Lim et al. ........... 365/185.19
2010/0302862 A1 * 12/2010 Lee ..................... 365/185.19

FOREIGN PATENT DOCUMENTS

| JP | 9-147582 A | 6/1997 |
|---|---|---|
| JP | 2000-285692 A | 10/2000 |
| JP | 2001-28575 A | 1/2001 |
| JP | 2001-325796 A | 11/2001 |
| JP | 2003-346485 A | 12/2003 |
| JP | 2008-27511 A | 2/2008 |
| JP | 2009-151912 A | 7/2009 |

(Continued)

OTHER PUBLICATIONS

Office Action issued on Nov. 18, 2014 by the Japanese Patent Office in corresponding JP Application No. 2014-084843.

*Primary Examiner* — Toan Le
(74) *Attorney, Agent, or Firm* — Muncy, Geissler, Olds & Lowe, P.C.

(57) ABSTRACT

A non-volatile semiconductor memory device includes a non-volatile memory cell array and a control circuit for controlling writing-in to the memory cell array. In the stage before an erasing pulse adding in an erasing process where data of written-in memory cells is erased, the control circuit detects a programming speed when writing-in to the memory cell array, determines a programming start voltage corresponding to the programming speed for every block or every word line, stores the determined programming start voltage in the memory cell array and reads-out the programming start voltage from the memory cell array to write-in predetermined data.

17 Claims, 17 Drawing Sheets

(56) References Cited

FOREIGN PATENT DOCUMENTS

| JP | 2009-283117 A | 12/2009 |
| JP | 2010-102751 A | 5/2010 |
| JP | 2011-519110 A | 6/2011 |
| WO | WO 2009/133533 A1 | 11/2009 |

* cited by examiner

Offset data of programming start voltage Vstart

Prior art

| Block | Programming start voltage Vstart |
|---|---|
| B1 | Vstart (0) |
| B2 | Vstart (0) |
| B3 | Vstart (0) |
| B4 | Vstart (0) |
| ... | Vstart (0) |

FIG. 11

Embodiment

| Block | Programming start voltage Vstart |
|---|---|
| B1 | Vstart (+1) |
| B2 | Vstart (0) |
| B3 | Vstart (-1) |
| B4 | Vstart (-2) |
| ... | ... |

FIG. 12

NONVOLATILE SEMICONDUCTOR MEMORY DEVICE AND WRITE-IN METHOD THEREOF

CROSS REFERENCE TO RELATED APPLICATIONS

This Application claims priority of Japan Patent Application No. 2012-001495, filed on Jan. 6, 2012, the entirety of which is incorporated by reference herein.

BACKGROUND OF THE INVENTION

1. Field of the Invention

The invention relates to an electrically rewritable non-volatile semiconductor memory device (EEPROM), such as a flash memory, etc, and a write-in method thereof.

2. Description of the Related Art

A highly integrated NAND-type non-volatile semiconductor memory device (refer to Patent Documents 1-4) which connects a plurality of memory cell transistors (hereinafter referred to as memory cells) to and between bit lines and source lines in series to form a NAND string is well known in the art.

In a common NAND-type non-volatile semiconductor memory device, when erasing, a high voltage, such as 20V, is applied to a semiconductor substrate and 0V is applied to a word line. As such, electrons are pulled out from a floating gate, i.e., a charge accumulation layer formed by poly-silicon material etc., and a threshold voltage is lower than an erasing threshold voltage (for example, −3V). In addition, in writing-in (programming), 0V is applied to the semiconductor substrate, and a high voltage, such as 20V, is applied to a control gate. As a result, electrons are injected from the semiconductor substrate into the floating gate, thereby making a threshold voltage higher than a write-in threshold voltage (for example, 1V). States of a memory cell which utilizes the threshold voltages may be determined by applying a readout voltage (for example, 0V) between the write-in threshold voltage and a readout threshold voltage to the control gate to determine whether a current is flowing through the memory cell.

For the described non-volatile semiconductor memory device, when writing-in to the memory cell, which is a write-in target, is performed through a programming operation, electrical charges are injected into the floating gate of the memory cell transistor and the threshold voltage increases. As a result, though a voltage which is lower than the threshold voltage is applied to the gate, there is no current flowing through the memory cell transistor, and a state where data '0' is written is achieved. In general, the threshold voltage of the memory cell in an erasing state has variations, and a write-in speed also has variations according to process variations. Therefore, when the programming operation is performed by applying a predetermined write-in voltage and the threshold voltage is verified to be higher than a verify-level, the threshold voltage of the memory cell after write-in has a distribution above the verify-level.

Meanwhile, because of process variations, for a memory having a write-in speed with large variations, a more efficient write-in method, ISPP (Increment Step Pulse Program) method, is used. In other words, if processing variations regarding to manufacturing process is large, a threshold voltage distribution after the writing-in to the memory cell is increased by 1 pulse. Simply, though verify technology is used for every bit, when trying to control the threshold voltage to be narrow, it still has to repeat write-in/verify smoothly, and as a result, it is necessary to perform long-running writing-in. Therefore, as shown in FIG. 4, a method where voltages of programming pulses PP begin from a programming start voltage Vstart and are increased by a predetermined step voltage Vstep as verifying is performed for every bit is provided.

PATENT DOCUMENTS

[Patent Document 1] JP H09-147582
[Patent Document 2] JP 2000-285692
[Patent Document 3] JP 2003-346485
[Patent Document 4] JP 2001-028575
[Patent Document 5] JP 2001-325796
[Patent Document 6] JP 2010-102751
[Patent Document 7] JP 2009-283117

BRIEF SUMMARY OF THE INVENTION

Problems to Be Solved

Here, for obtaining a threshold voltage distribution that programs a NAND-type flash EEPROM, the programming start voltage Vstart shown below is an important parameter. As shown in FIG. 5, the programming start voltage Vstart decides a width of the threshold voltage distribution. Here, in order to narrow the threshold voltage distribution, it is preferable to use a lower programming start voltage Vstart, and accordingly a programming time is lengthened. In addition, if a higher programming start voltage Vstart is used, the programming time is shortened, and there would be a problem that the threshold voltage distribution would become wider. Moreover, after cycles of programming and erasing, if the programming start voltage Vstart is the same, the threshold voltage distribution becomes wider, and there would be a problem that a programming speed would varies depending of word lines in blocks of a memory cell array. Therefore, optimization of the programming start voltage Vstart is an important issue.

In prior arts, generally, the same programming start voltage Vstart is used for one chip. In the manufacturing of the applicant, variations of the programming speed of each block or each word line for a single chip are not consideration (for example, referring to Patent Document 6). Also, as described above, when the programming speed is high, the threshold voltage distribution for each block becomes wider. Accordingly, durability gets worse because of the degradation of the oxide film along with data rewriting, resulting in a problem where it is difficult to obtain a high-speed multi-rewriting characteristic.

FIG. 6 is a diagram showing a distribution of a threshold voltage Vth when the same programming start voltage Vstart is used for programming when the ISPP (Increment Step Pulse Program) method of FIG. 4 is used for programming the NAND-type flash EEPROM. FIG. 11 shows the programming start voltage Vstart used in prior arts. Regarding FIG. 11, as it is clearly shown from FIG. 6, when the same programming start voltage Vstart is used in every block for programming, there's a problem that the threshold voltage distribution varies.

In order to solve this problem, for example, Patent Document 7 shows a method for changing the programming start voltage. To provide a programming method of a non-volatile memory device that sets the programming start voltage differently according to the programming speed of each block, the programming method of the non-volatile memory device shown in Patent Document 7 comprises: performing a programming operation on a first page; counting a number of applied programming pulses until the programming operation on the first page is completed; comparing the counted number and a critical value to reset the programming start voltage based on the comparison result; and performing the programming operation on a second page using the reset programming start voltage.

In the programming method of Patent Document 7 as mentioned above, an optimal programming start voltage cannot be used for the first page. Furthermore, since only the number of programming pulse is counted, there's a problem where it is difficult to optimize the programming start voltage for eliminating variations of the threshold voltage distribution.

The purpose of the invention is to solve the problems mentioned above and provide a non-volatile semiconductor memory device capable of minimizing variations of a threshold voltage distribution after programming and obtaining a high-speed multi-rewriting characteristic and a write-in method of the non-volatile semiconductor memory device.

Means for Solving the Problems

A non-volatile semiconductor memory device, comprising: a non-volatile memory cell array; and a control circuit for controlling writing-in to the memory cell array, wherein before or after an erasing process where data of written-in memory cells is erased, the control circuit detects a programming speed when writing-in to the memory cell array, determines a programming start voltage corresponding to the programming speed for every block or every word line, stores the determined programming start voltage in the memory cell array and reads-out the programming start voltage from the memory cell array to write-in predetermined data.

In the non-volatile semiconductor memory device, before the erasing process, the control circuit detects the programming speed by using data stored in memory cells of word lines of the memory cell array.

Otherwise, in the non-volatile semiconductor memory device, before the erasing process, the control circuit detects the programming speed by using predetermined memory cells of dummy word lines of the memory cell array.

Otherwise, in the non-volatile semiconductor memory device, before the erasing process, the control circuit detects the programming speed by using predetermined memory cells of word lines of the memory cell array.

Otherwise, in the non-volatile semiconductor memory device, after the erasing process, the control circuit detects the programming speed by using memory cells of dummy word lines of the memory cell array.

In addition, in the non-volatile semiconductor memory device, the control circuit detects the programming speed by using data of only one word line for each erasing process.

Here, when the programming speed is detected by using data of only one word line, a position in a memory cell string of the word line used to detect the programming speed is shifted for every erasing process, and a predetermined number of times of erasing process is regarded as one cycle.

Moreover, in the non-volatile semiconductor memory device, in a detection checking of the programming speed, a number of times of erasing is counted for each erasing process, counting information is stored as flag bits in the same way as programming speed data is stored, and when the number of times of erasing reaches a predetermined number, a programming speed checking process is performed and the data is refreshed.

Moreover, in the non-volatile semiconductor memory device, the control circuit stores the determined programming start voltage in memory cells of dummy word lines of the memory cell array.

Furthermore, in the non-volatile semiconductor memory device, the control circuit stores the determined programming start voltage in additional memory cells of word lines of the memory cell array.

Here, in order to store the determined programming start voltage, for each word line, a memory area of at least N bytes corresponding to a number N of word lines used to perform a detection of the programming speed is prepared, and the determined programming start voltage is stored in memory cells of word lines used in the detection of the programming speed corresponding to each erasing process.

Here, when a word line used to detect the programming speed also serves as data of more than at least one adjacent word line in a string, the determined programming start voltage is not stored in word lines used to perform the detection of the speed but in the word line corresponding to the determined programming start voltage using memory area of N bytes, and shifting is performed for each erasing process.

In the non-volatile semiconductor memory device, when storing the determined programming start voltage in memory cells of dummy word lines or word lines of the memory cell array, the control circuit performs write-in by adding bits of ECC (Error Correcting Code) to data of the programming start voltage.

Here, when bits of the ECC are added, bit cells having more than three bits are used to write-in for one bit of data.

Moreover, in the non-volatile semiconductor memory device, the control circuit reads out the stored programming start voltage in one reading-out cycle and uses the read-out programming start voltage to write-in the predetermined data.

Also, in the non-volatile semiconductor memory device, the control circuit reads out the stored programming start voltage in one reading-out cycle and memorizes all of the read-out programming start voltages in a register, and if a programming process that writes-in the predetermined data is performed in corresponding block, the control circuit reads out a programming start voltage corresponding to the word line from the register to write-in the predetermined data.

A write-in method for a non-volatile semiconductor memory device, wherein the non-volatile semiconductor memory device comprises a non-volatile memory cell array and a control circuit for controlling writing-in to the memory cell array, and wherein before or after an erasing process where data of written-in memory cells is erased, the control circuit detects a programming speed when writing-in to the memory cell array, determines a programming start voltage corresponding to the programming speed for every block or every word line, stores the determined programming start voltage in the memory cell array and reads-out the programming start voltage from the memory cell array to write-in predetermined data.

Effect of the Invention

Therefore, according to a non-volatile semiconductor memory device and a write-in method thereof of the invention, a programming speed is detected during writing-in to the memory cell array before or after an erasing process where data of written-in memory cells is erased. Also, a programming start voltage is determined corresponding to the programming speed for every block or every word line. The determined programming start voltage is stored in the memory cell array and the programming start voltage is readout from the memory cell array to write-in predetermined data. Accordingly, variation of the threshold voltage distribution after programming is minimized and a high-speed rewriting characteristic can be obtained.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 11 shows a programming start voltage Vstart used in prior arts;

FIG. 12 shows a programming start voltage used in an embodiment of the invention;

DETAILED DESCRIPTION OF THE INVENTION

The embodiments of the invention are described below with references made to the accompanying drawings. The same element in every embodiment below is marked as the same symbol.

Figure 1:
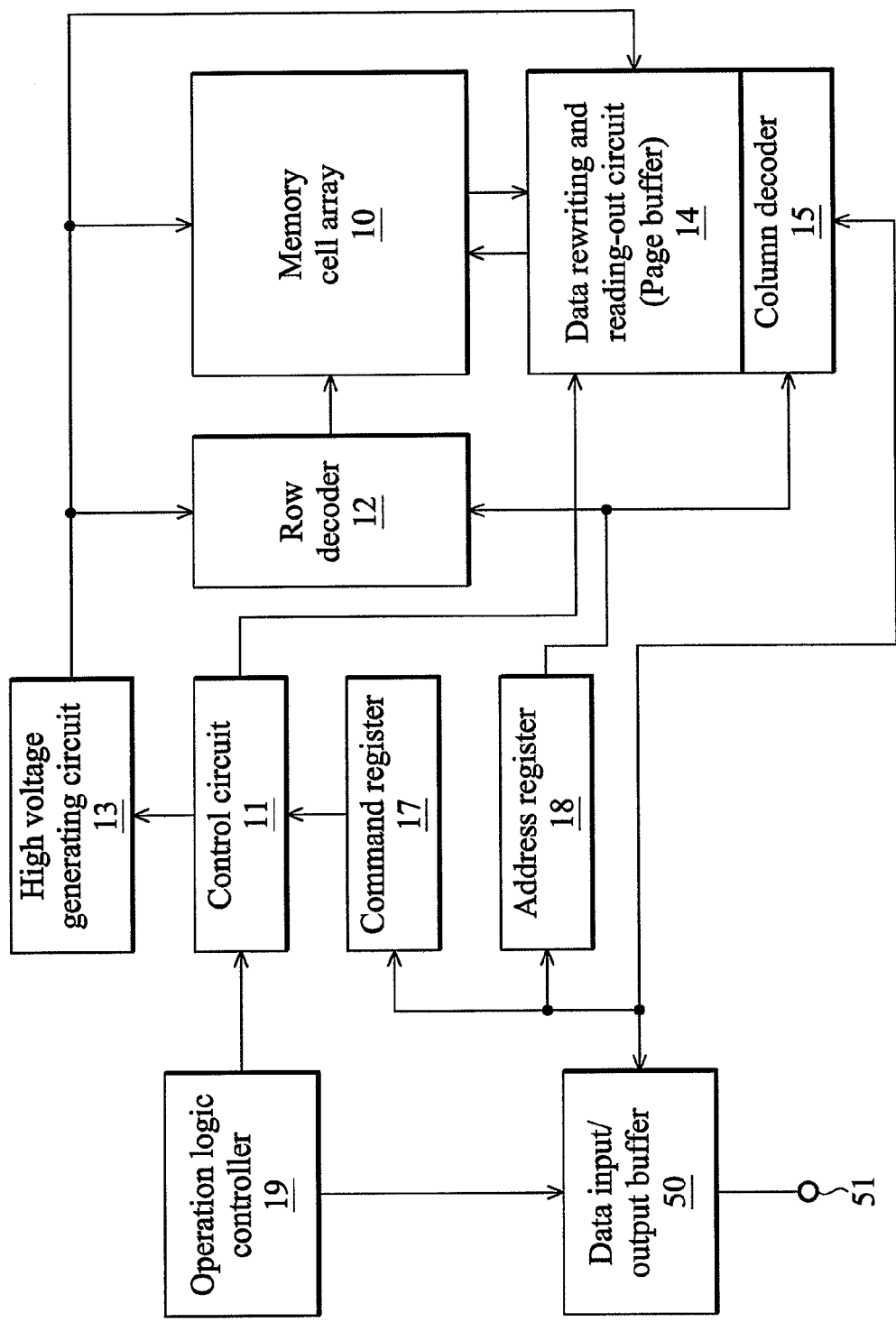
FIG. 1 is a block diagram of an overall configuration of a NAND-type EEPROM according to an embodiment of the invention.
Figure 2:
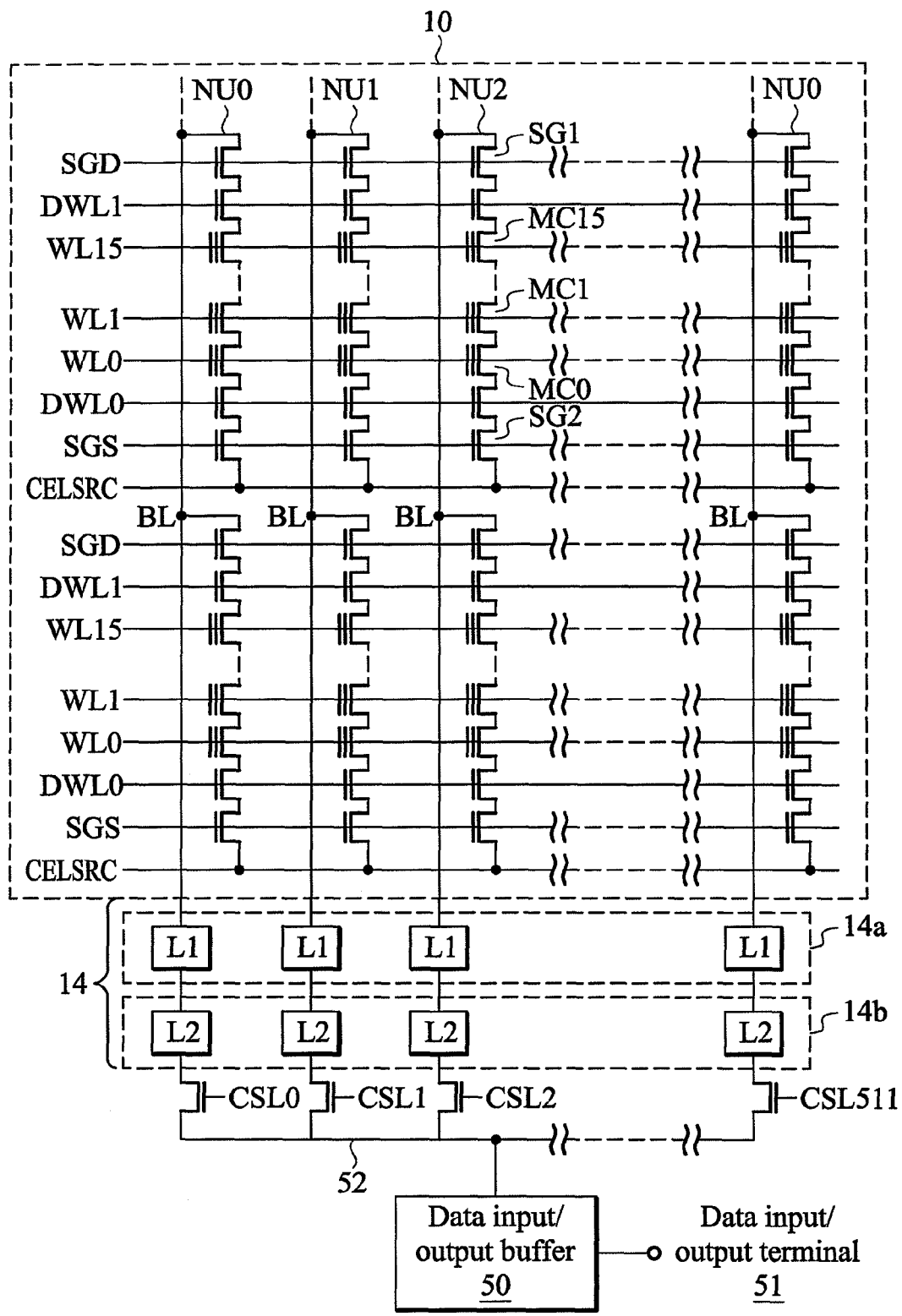
FIG. 2 is a circuit diagram of a configuration of the memory cell array 10 of FIG. 1 and its peripheral circuit.
Figure 3:
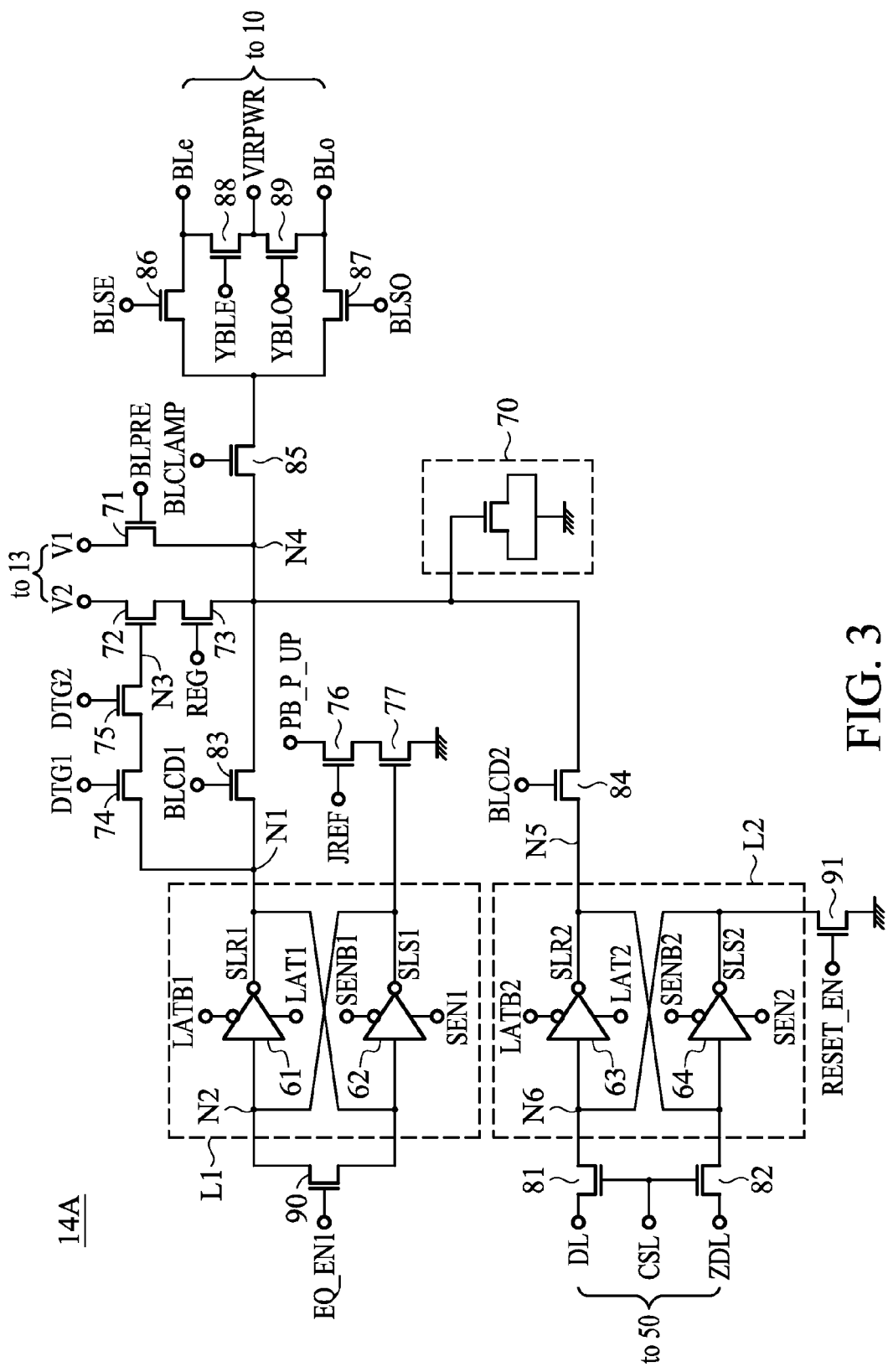
FIG. 3 is a circuit diagram of a detailed configuration of a page buffer (corresponding to two bit lines) of FIG. 2.
Figure 4:
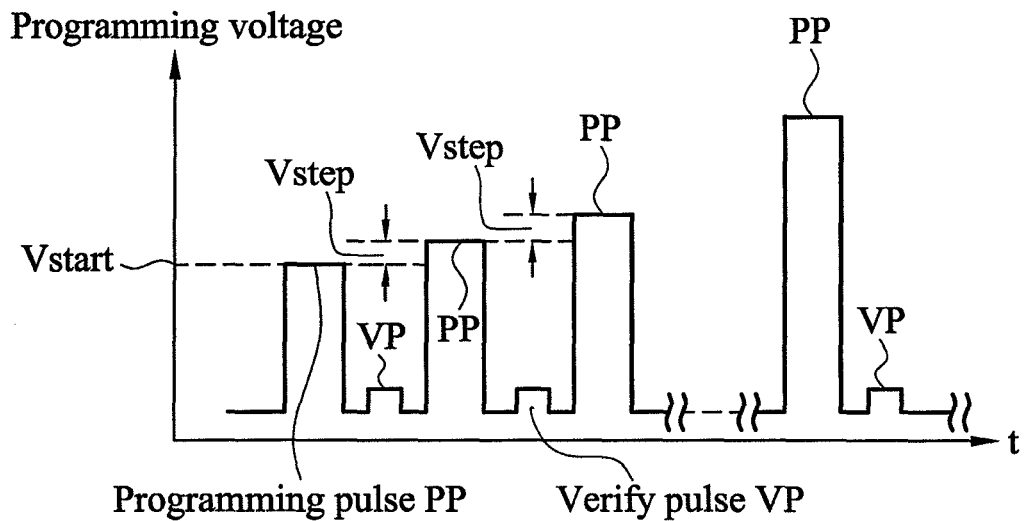
FIG. 4 is a timing chart showing a write-in method when a NAND-type flash EEPROM is programmed by using an ISPP (Increment Step Pulse Program) method according to prior arts.
Figure 5:
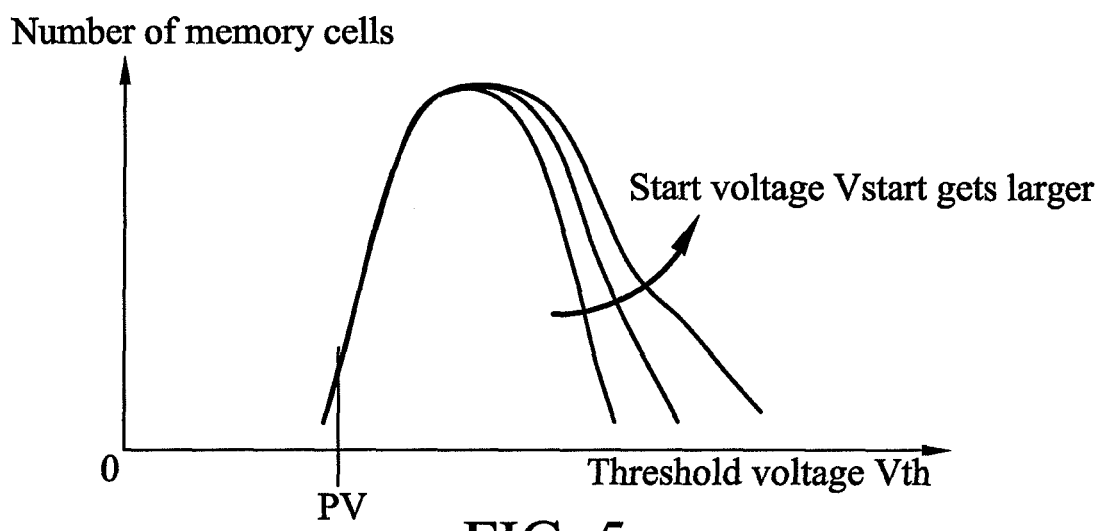
FIG. 5 is a block diagram of a threshold voltage Vth distribution when a programming start voltage Vstart is changed at the time when a NAND-type flash EEPROM is programmed by using the ISPP (Increment Step Pulse Program), method of FIG. 4.
Figure 6:
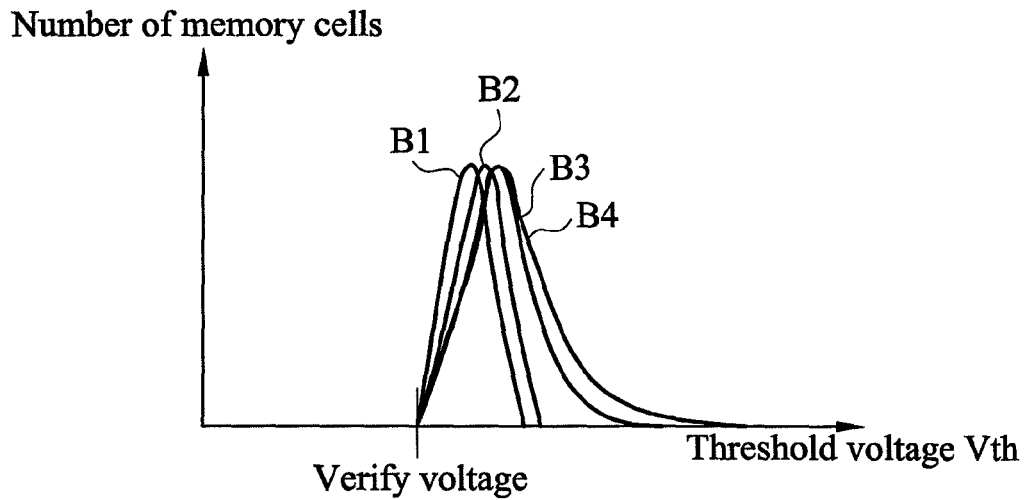
FIG. 6 is a block diagram of a threshold voltage Vth distribution when the same programming start voltage Vstart is used for programming at the time when a NAND-type flash EEPROM is programmed by using the ISPP (Increment Step Pulse Program) method of FIG. 4.

FIG. 1 shows a block diagram showing an overall configuration of a NAND-type flash EEPROM according to an embodiment of the invention. In addition, FIG. 2 shows a circuit diagram of a configuration of the memory cell array 10 in FIG. 1 and its peripheral circuit. Moreover, FIG. 3 shows a circuit diagram of a detailed configuration of a page buffer (corresponding to 2 bit lines) in FIG. 2. First, the configuration of the NAND-type flash EEPROM according to the embodiment is described below.

In FIG. 1, the NAND-type flash EEPROM according to the embodiment comprises a memory cell array 10, a control circuit 11 for controlling operations of the memory cell array 10, a row decoder 12, a high voltage generating circuit 13, a data rewriting and reading-out circuit 14, a column decoder 15, a command register 17, an address register 18, an operation logic controller 19, a data input/output buffer 50, and a data input/output terminal 51.

As shown in FIG. 2, in the memory cell array 10, a NAND cell unit NU (NU0, NU1, . . . ) is formed by connecting for example 18-stack-gate structured electrically rewritable non-volatile memory cells MC0~MC15, MCD0 and MCD1 in serial. In each NAND cell unit NU, a drain side is connected to a bit line BL through a selective gate transistor SG1, and a source side is connected to a common source line CELSRC through a selective gate transistor SG2. Control gates of memory cells MC lined in row direction are collectively connected to word lines WL, and gate electrodes of the selective gate transistors SG1 and SG2 are connected to selective gate lines SGD and SGS arranged parallel to the word lines WL. Here, a dummy word line DWL0 parallel to every word line is formed between the selective gate line SGS and the word line WL0, and a dummy word line DWL1 parallel to every word line is formed between the selective gate line SGD and the word line WL15. One page, a unit for write-in and readout, is a range of memory cells selected by each of the word lines WL. One block, a unit for data erasing, is a range of a plurality of NAND cells NU in one page or its integer multiples. In order to perform rewriting and reading-out of data of a page unit, the rewriting and reading-out circuit 14 comprises a sense amplifier circuit (SA) and a latch circuit (DL), called a page buffer below.

The memory cell array 10 in FIG. 2 has a simplified configuration, wherein a plurality of bit lines can share a page buffer. In this case, one page unit is a number of bit lines selectively connected to the page buffer when writing-in or reading-out data. In addition, FIG. 2 shows a range of the cell array where inputs and outputs of data are performed within one input/output terminal 51. In order to select word lines WL and bit lines BL of the memory array 10, the corresponding row decoder 12 and the corresponding column decoder 13 are arranged. The control circuit 11 performs a sequence control for writing-in, erasing and reading-out data. The high voltage generating circuit controlled by the control circuit 11 generates high voltages or middle voltages used for rewriting, erasing and reading-out data.

The input/output buffer 50 is used for input/output of data and input of address signals. That is, data is transmitted between the input/output terminal 51 and the page buffer 14 through the input/output buffer 50 and the data line 52. The address signals inputted from the input/output terminal 51 are stored in the address register 18 and sent to the row decoder 12 and the column decoder 15 for decoding. Commands of controlling operations are also inputted from the input/output terminal 51. The inputted commands are decoded and stored in the command register 17 so as to make the control circuit 11 perform controlling. External control signals, such as chip enable signals CEB, command latch enable signals CLE, address latch enable signals ALE, write-in enable signals WEB, readout enable signals REB, etc, are taken into the action logic controller 19, and inner control signals corresponding to operation modes are generated. The inner control signals are used for controlling of the input/output buffer 50, such as data latching, transmitting, etc, and are sent to the control circuit 11 so as to perform controlling operations.

The page buffer 14, comprising two latch circuits 14a and 14b, is configured to be capable of performing switching between functions of multi-valued operations and cache. In other words, when two-valued data of one bit is memorized in one memory cell, a cache function is provided; and when four-valued data of two bits is memorized in one memory cell, a cache function is provided and cache function is still effective even though limited by an address. The detailed configuration of the page buffer 14A (corresponding to 2 bit lines) for implementing the function is shown in FIG. 3.

In FIG. 3, the page buffer 14A is configured to comprise a latch L1 formed by two inverters 61 and 62, a latch L2 formed by two inverters 63 and 64, a verifying capacitor 70, a pre-charging transistor 71, verifying transistors 72-75, verifying and pass/fail judging transistors 76 and 77, column gate transistors 81 and 82, transmitting switch transistors 83-85, 88 and 89, bit line selecting transistors 86 and 87, a latch equalizing transistor 90 and a reset transistor 91.

In FIG. 3, two bit lines BLe are BLo are selectively connected to the page buffer 14A. In this case, the page buffer 14A is selectively connected to the bit line BLe or BLo by conducting the bit line selecting transistor 86 or 87 according to a bit line selecting signal BLSE or BLSO, respectively. In addition, when one of the bit lines is selected, it is preferred that the other bit line which is not selected is set at a fixed ground level or voltage level to reduce noises between adjacent bit lines.

The page buffer 14A in FIG. 3 comprises a first latch L1 and a second latch L2. The page buffer 14A mainly contributes to reading-out, writing-in and erasing operations according to predetermined operation controls. Moreover, the second latch L2, a secondary latch circuit for realizing a cache function in a two-valued operation, additionally realizes multi-valued operations contributing to operations of the page buffer 14A when the cache function is not used.

The latch L1 is formed by connecting clocked inverters 61 and 62 in parallel. The bit line BL of the memory cell array 10 are connected to a sense node N4 through the transmitting switch transistor 85 and the sense node N4 is connected to a data holding node N1 of the latch L1 through the transmitting switch transistor 83. The pre-charging transistor 71 is arranged in the sense node N4. The node N1 is connected to a temporally-memorizing node N3, which is used for temporally memorizing the data of the node N1, through the transmitting switch transistor 74 and 75. Furthermore, the node N4 is connected to the pre-charging transistor 71, which is used for pre-charging a voltage V1 to the bit line. The node N4 is coupled to the capacitor 70, which is used for maintaining voltage levels in the node N4. The other terminal of the capacitor 70 is coupled to the ground.

Like the first latch L1, the second latch L2 is formed by connecting clocked inverters 63 and 64 in parallel. Two data nodes N5 and N6 of the latch L2 are connected to the data line 52, which is connected to the data input/output buffer 50, through the column gate transistors 81 and 82, which are controlled by a column selecting signal CSL. The node N5 is connected to the node N4 through the transmitting switch transistor 84.

FIG. 2 shows a connecting relation of the memory cell array 10, the page buffer 14 and the data input/output buffer 50. A processing unit of readout and write-in of the NAND-type flash EEPROM is a capacity of one page selected simultaneously in a row address (for example, 512 bytes). In the example of 512 bytes, since there are 8 input/output terminals 51, each input/output terminal 51 has 512 bits, and the configuration of these 512 bits is shown in FIG. 2.

When data are written-in to the memory cell, the write-in data is taken into the second latch L2 from the data line 52. The write-in data must be at the latch L1 to start the write-in operation. Therefore, the data held by the latch L2 are subsequently transmitted to the latch L1. Moreover, in the readout operation, the readout data must be at the latch L2 to be output to the data input/output terminal 51. Therefore, the data readout by the latch L1 has to be transmitted to the latch L2. Accordingly, the configuration can transmit data between the latch L1 and the latch L2 by turning on the transmitting transistors 83 and 84. At this time, a latch circuit which is a destination is switched to an inactive state and transmits the data, and then a latch circuit which is a following destination is switched back to an active state and holds the data.

In FIG. 1 to FIG. 3, basic operations of writing-in and erasing data to the memory cell 10 are known, for example, as shown in Patent Documents 4-5. Detailed description is omitted.

The embodiment provides a write-in method for a NAND-type flash EEPROM that uses an improved ISPP method which is capable of minimizing variations of a voltage distribution after programming and obtaining a high-speed multi-rewriting characteristic. The write-in method according to the embodiment has features of changing a programming start voltage Vstart for every block or every word line, storing a programming start voltage determined according to a checking result of a programming speed after the programming speed is checked and reading-out the information to perform writing-in of predetermined data.

Figure 7:
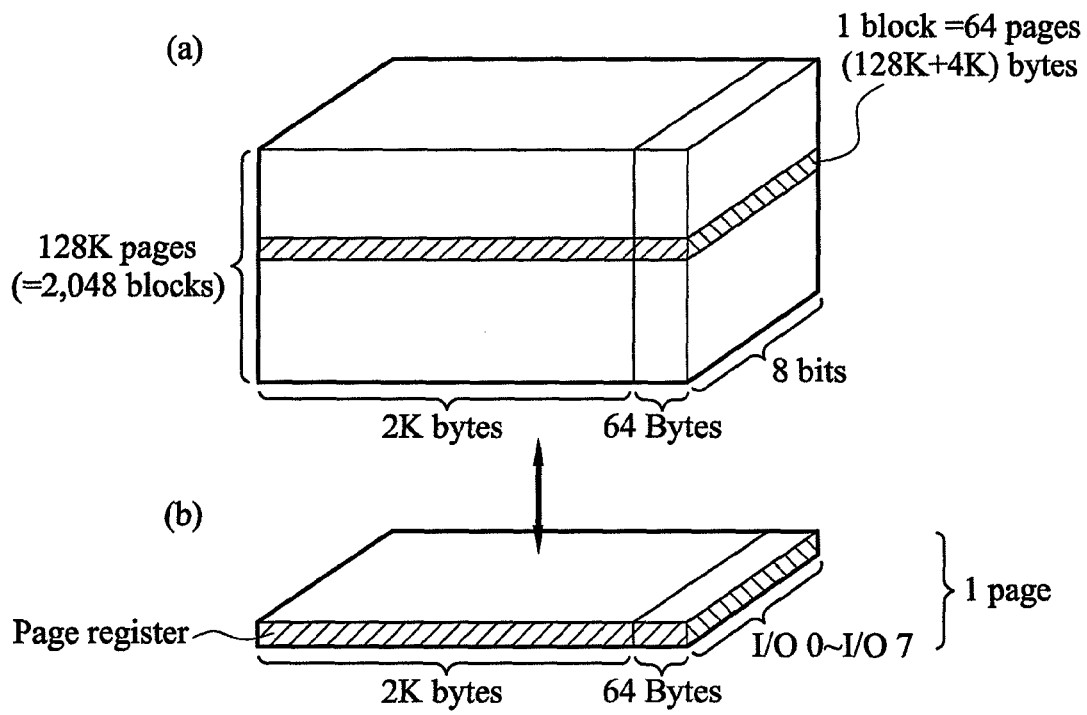
FIG. 7 shows a three-dimensional conceptual diagram of a concept of a page and a block in a common NAND-type flash EEPROM.

FIG. 7 shows a three-dimensional conceptual diagram of a concept of a page and a block in a common NAND-type flash EEPROM (SLC2G bit). As clearly shown in FIG. 7, one page is formed by 2064 bytes×8 bits, one block is formed by 64 pages, and there are 128K pages in total. The page buffer 14 is used for performing writing-in and reading-out for every page and performing erasing for every block.

FIG. 11 shows a programming start voltage Vstart used in prior arts, and FIG. 12 shows a programming start voltage used in an embodiment of the invention. In prior arts, the programming start voltage Vstart for each block is the same. On the other hand, as shown in FIG. 12, determining the corresponding optimal programming start voltage Vstart for every block is used in the embodiment. Note that in FIG. 12, data in parentheses of a programming start voltage Vstart(·)

represents offset data from a predetermined standard programming start voltage Vstart(0). For example, if a unit of a offset voltage is 0.3 V, Vstart(+2)=Vstart(0)+2×0.3V.

Figure 8:
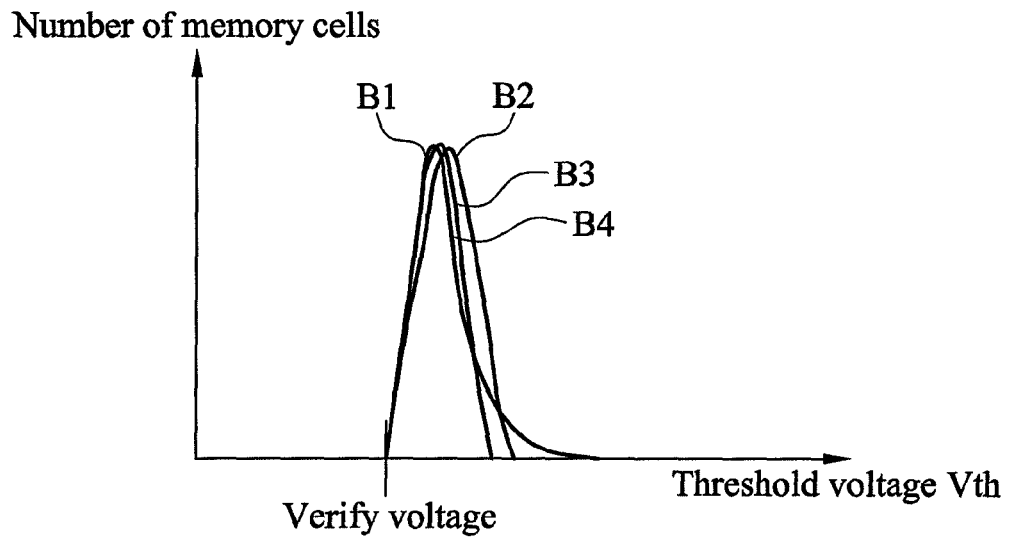
FIG. 8 is a distribution diagram of a threshold voltage Vth showing the effect of using a write-in method that optimizes a programming start voltage Vstart for every block or every word line according to an embodiment of the invention.

FIG. 8 is a distribution diagram of a threshold voltage Vth showing the effect of using a write-in method that optimizes a programming start voltage Vstart for every block or every word line according to an embodiment of the invention. According to the embodiment, the programming start voltage Vstart is optimized for every block or every word line and hence the fluctuation of the threshold voltage distribution for every block or every word line is minimized as shown in FIG. 8. Therefore, compared with prior arts, the durability influenced by the degradation of the oxide film along with data rewriting is improved, and there's a special effect that a high-speed multi-rewriting characteristic can be obtained.

Figure 9:
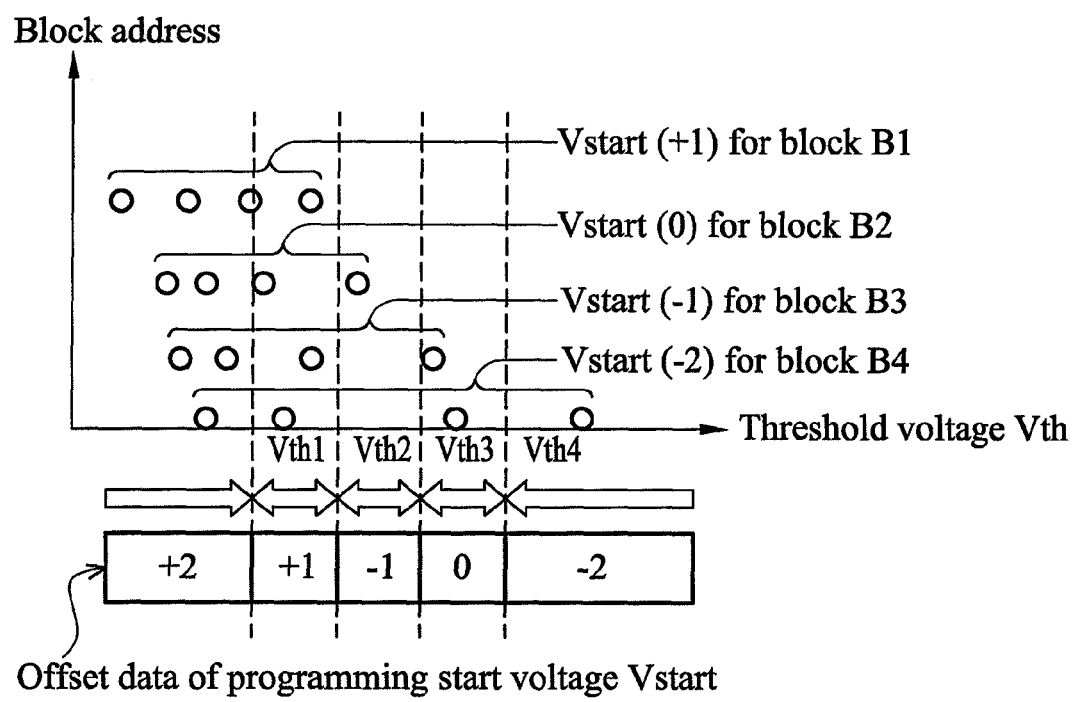
FIG. 9 is a distribution diagram of the threshold voltage Vth showing the effect of a programming speed checking process using the write-in method of FIG. 8.

FIG. 9 is a distribution diagram of the threshold voltage Vth showing the effect of a programming speed checking process using the write-in method of FIG. 8. The programming speed checking process is performed in the following manner. As shown in FIG. 9, for the sake of testing, a programming stress is applied to memory cells of specific bits (test bits) for every block or every word line. The threshold voltage distribution of the specific bits is detected by performing a verify read using a number of voltage levels (four voltage levels in FIG. 9, offset for every Δ Vstep). Based on the largest threshold voltage of the fastest bit in the specific bits for the test, the programming start voltage Vstart for the block or the word line is determined. For example, the programming start voltage Vstart(0)=15~16 V, Vstep=0.3V and Δ Vstep=0.1V in MLC (Multi Level Cell), and Vstep=1.1V and Δ Vstep=0.2~0.5V in SLC(Single Level Cell).

With respect to data of the determined programming start voltage Vstart(·) described above, it is preferable to store the corresponding offset values on memory cells of the specific bits of dummy word lines of each block. For example, bits (110) corresponding to the programming start voltage Vstart (−2), bits (101) corresponding to the programming start voltage Vstart(−1), bits (100) corresponding to the programming start voltage Vstart(0), bits (011) corresponding to the programming start voltage Vstart(+1) and bits (010) corresponding to the programming start voltage Vstart(+2) are stored in the specific bits. Here, since the program start value is an important value, errors are not allowed. For example, for each bit of the three bits, at least three bits of bit cells are used for writing, and hence the majority rule may be used when reading-out. Moreover, for example, writing data by a programming process in one writing pulse using the voltage (Vstart+ n×Vstep) is programmed, and reading-out data of the programming start voltage Vstart(·) of a dummy word line using a determining method of the majority rule is used for programming. In this case, data of the programming start voltage Vstart(·) set to each word line is also stored in memory cells of dummy word lines of the block. If data of the determined programming start voltage Vstart(·) is stored in memory cells of specific bits of normal writing word lines, additional memory cells for this purpose are necessary.

Figure 13:
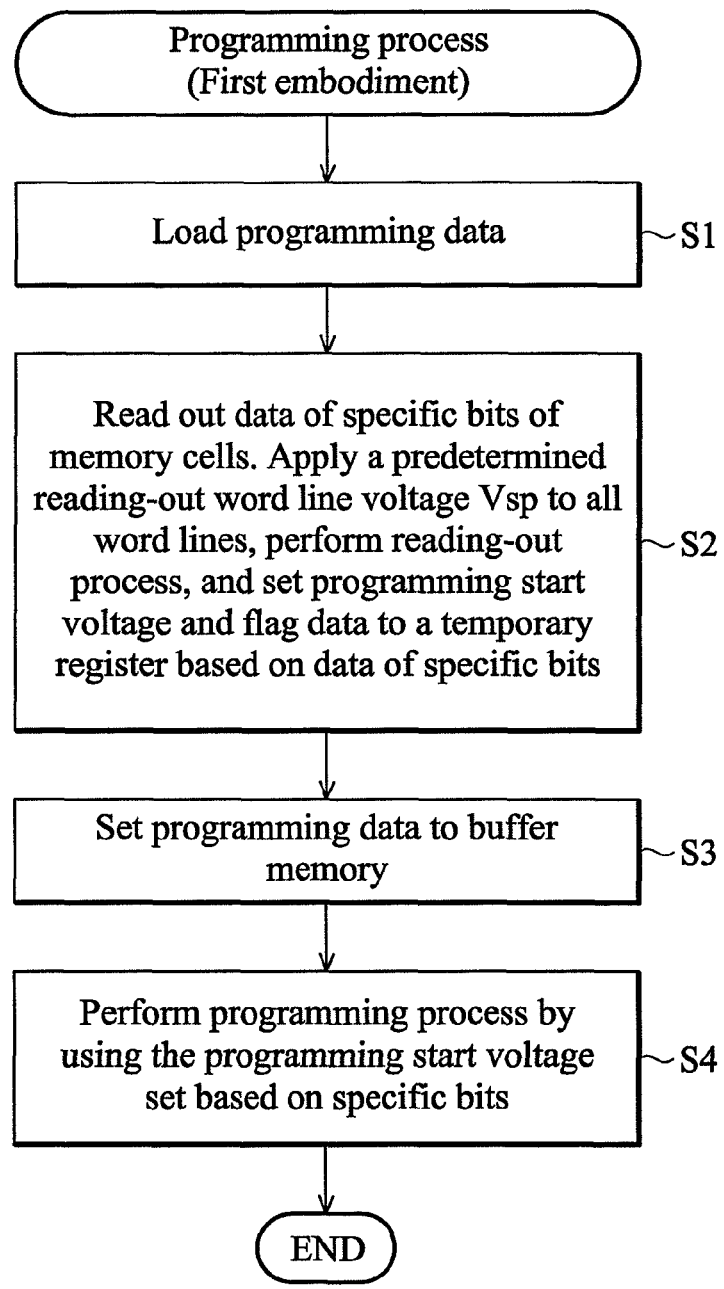
FIG. 13 is a flowchart showing a programming process according to a first embodiment of the invention.

FIG. 13 is a flowchart showing a programming process according to a first embodiment of the invention. In FIG. 13, first, programming data is loaded in step S1. In step S2, data of specific bits of a block selected for write-in is read out before a programming pulse is applied. Vstart of the block or each word line of the block is stored in the data. More specifically, first, as mentioned above, when the data is stored in a dummy word line, the dummy word line is selected and read-out. When the data is stored in normal word lines where additional memory cells are added, after a predetermined reading-out voltage Vsp is applied to all word lines, reading-out is performed once. Then, a programming start voltage and flag data are set to a temporary register (buffer memory) based on data of specific bits corresponding to selected word lines. Next, in step S3, the programming data is set to the buffer memory 14*a*. Furthermore, in step S4, a programming process using an ISPP method using the programming start voltage set based on specific bits is performed. One large requirement for the write-in method according to the embodiment is that a programming time for maintaining a programming throughput can't be increased, and for this reason, a programming speed checking process is performed in the erasing operation.

In the step S2 of FIG. 13, basically, a programming start voltage Vstart(·) is determined by reading-out data from specific bits of memory cells. In case of continuous programming of word lines WL3~WL28, data is read-out from specific bits of memory cells only during the programming of the word line WL3. During programming of remaining word lines WL4~WL28, the programming start voltage Vstart(·) is read-out from the temporary register to reduce extra programming time.

Figure 14:
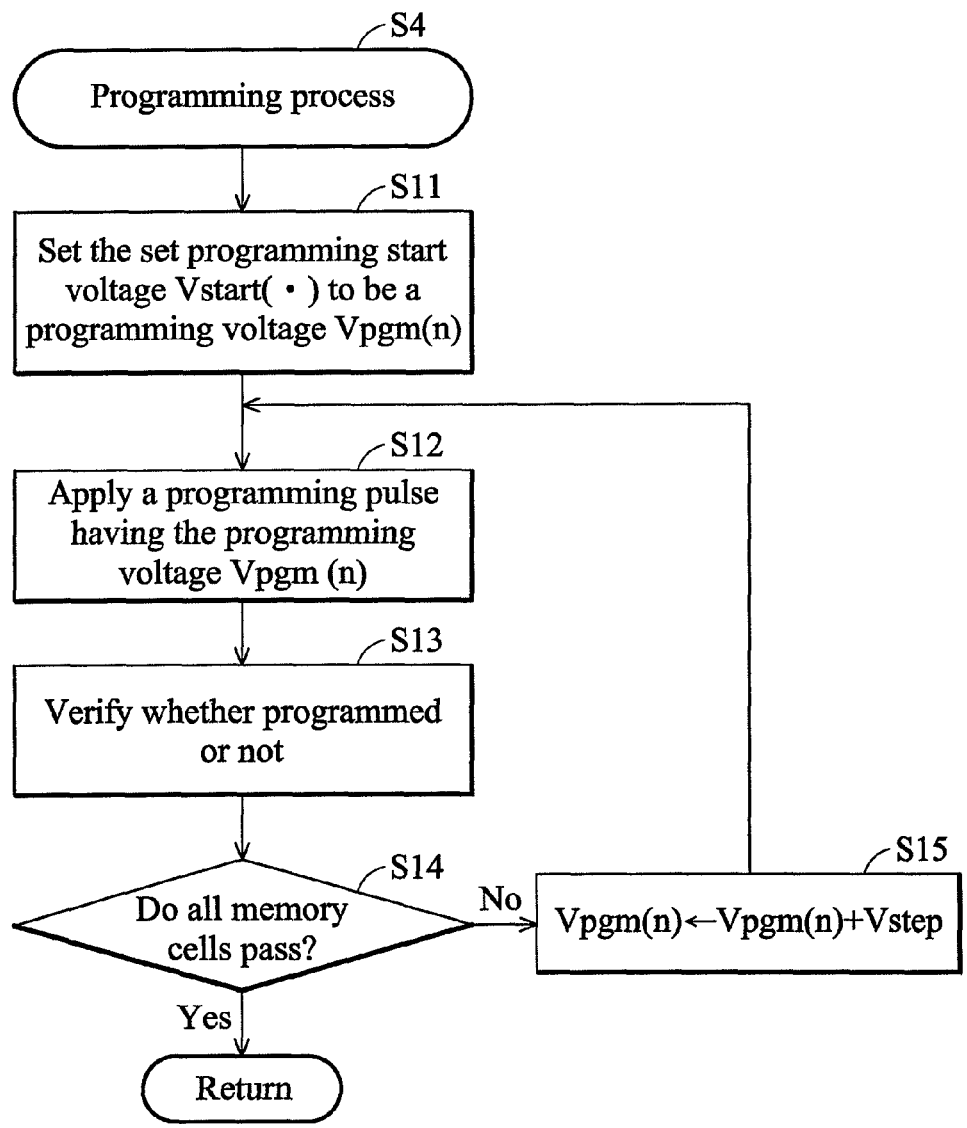
FIG. 14 is a flowchart showing the programming process (S4) which is a subroutine of FIG. 13.

FIG. 14 is a flowchart showing the programming process (S4) which is a subroutine of FIG. 13. In FIG. 14, the set programming start voltage Vstart(·) is set to be a programming voltage Vpgm(n) in step S11. A programming pulse having the programming voltage Vpgm (n) is applied in step S12 and whether programmed or not is verified in step S13. It is judged whether all memory cells pass or not in step S14, and then the programming process goes back to the original main routine if yes or goes to step S15 if no. In step S15, the programming voltage Vpgm (n) is incremented by an increment Vstep to set the programming voltage Vpgm (n) and then the process proceeds back to step S12.

Figure 15:
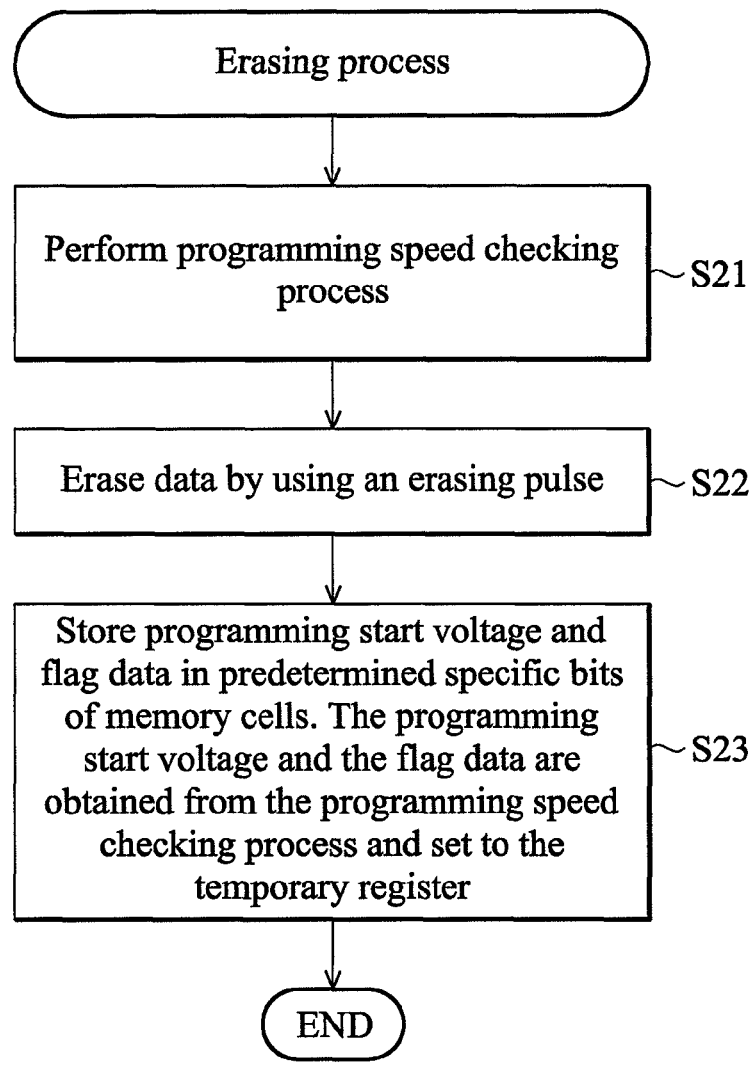
FIG. 15 is a flowchart showing an erasing process performed previous to the programming process of the first embodiment.

FIG. 15 is a flowchart showing an erasing process performed previous to the programming process of the first embodiment. In the erasing process, a programming start voltage setting process (Example 1) is performed. In FIG. 15, a programming speed checking process (FIG. 16) is performed in step S21. In step S22, data is erased by using an erasing pulse. Then, in step S23, a programming start voltage and flag data, which are obtained from the programming speed checking process and set to the temporary register, are stored in predetermined specific bits of memory cells. Specifically, after the programming start voltage and the flag data stored in the temporary register are set to the page buffer 14, a corresponding word line (or dummy word line) is selected, and a programming is performed by performing such as a normal SLC programming process.

Figure 16:
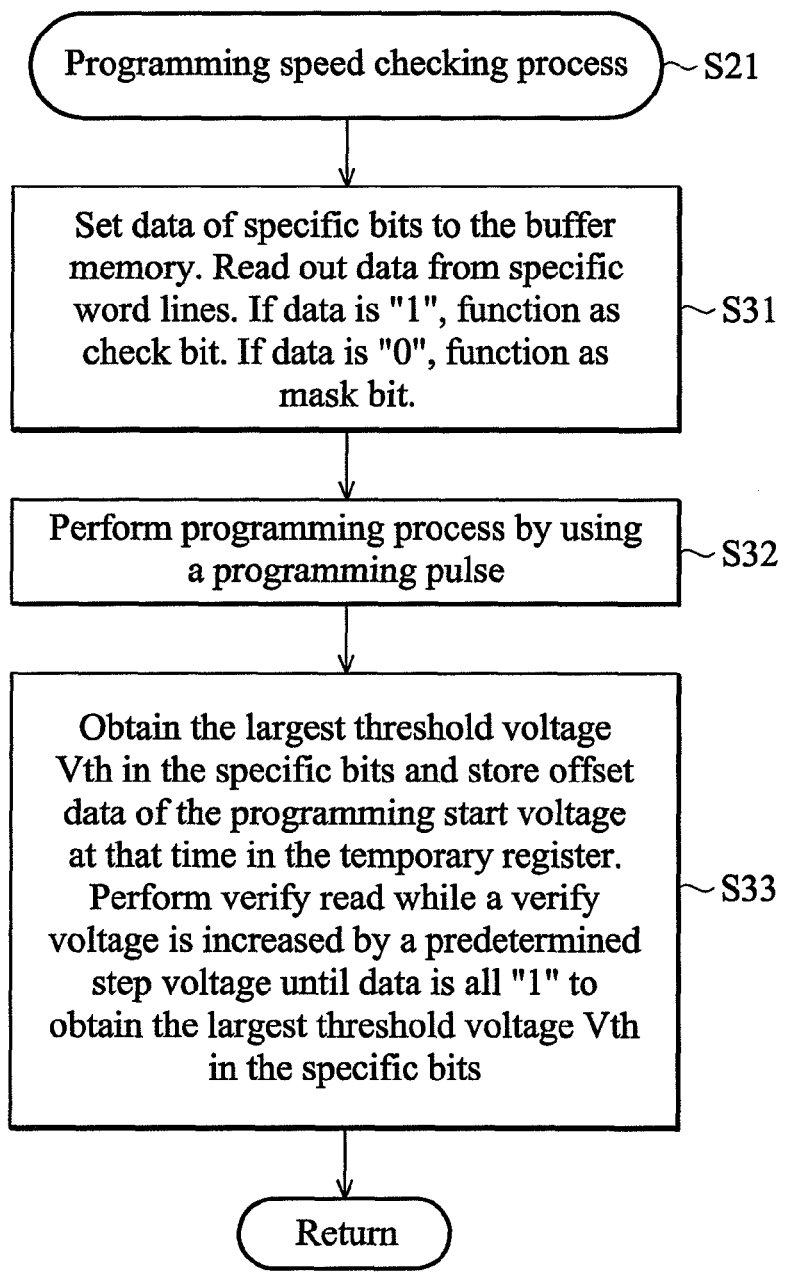
FIG. 16 is a flowchart showing a programming speed checking process (S21) which is a subroutine of FIG. 15.

FIG. 16 is a flowchart showing the programming speed checking process (S21) which is a subroutine of the programming process in FIG. 15. In FIG. 16, first, for specific bits of memory cells, data is set to the buffer memory 14 in step S31. Specifically, data is read out from specific word lines. If data is "1", it functions as a check bit. If data is "0", it functions as a mask bit. Next, in step S32, a programming process is performed by using a programming pulse. Further, in step S33, the largest threshold voltage Vth in the specific bits is obtained, offset data of the programming start voltage at that time is stored in the temporary register, and then the process proceeds back to the original main routine. Here, in order to obtain the largest threshold voltage in the specific bits, the verify read is performed while a verify voltage is increased by a predetermined step voltage until data bits are all data "1" for example.

When "1" of data of users is used to obtain check bits in step S31 of FIG. 16, data of users does not always have a number that is enough to check bits of "1". Therefore, when user data is used in this way, if a number of data "0", counted in step S1 of the programming process as shown in FIG. 13, is bigger than a half of the page size, a reverse flag bit is set and the data is reversed in step S3. According to this process, a number of data "1" can always be above a half of the page size. Furthermore, when reading-out, if there stands a reverse flag in data, the data is of course reversed and then outputted.

Figure 17:
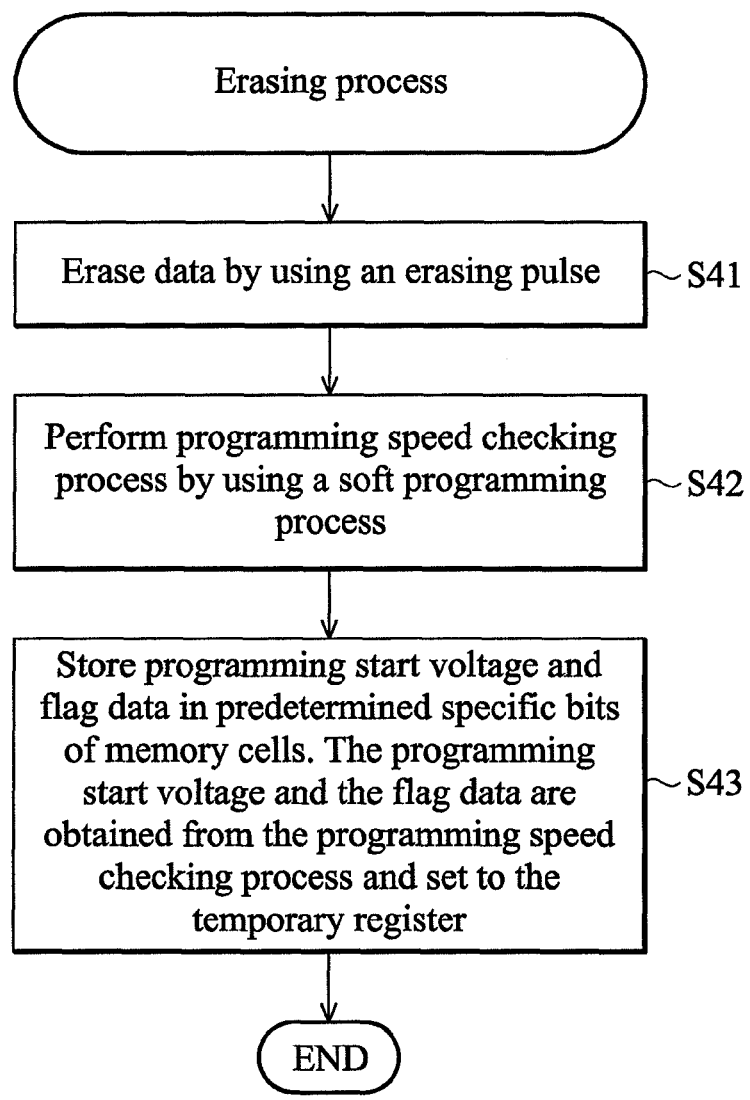
FIG. 17 is a flowchart showing an erasing process (Example 2) performed previous to the programming process of the first embodiment.

FIG. 17 is a flowchart showing an erasing process in another form performed previous to the programming process of the first embodiment. In the erasing process, a programming start voltage setting process (Example 2) is performed. In FIG. 17, first, data is erased by using an erasing pulse in step S41. In step S42, a programming speed checking process is performed by using a soft programming process. Then, in step S43, a programming start voltage and flag data, which are obtained from the programming speed checking process and set to the temporary register, are stored in predetermined specific bits of memory cells.

Figure 18:
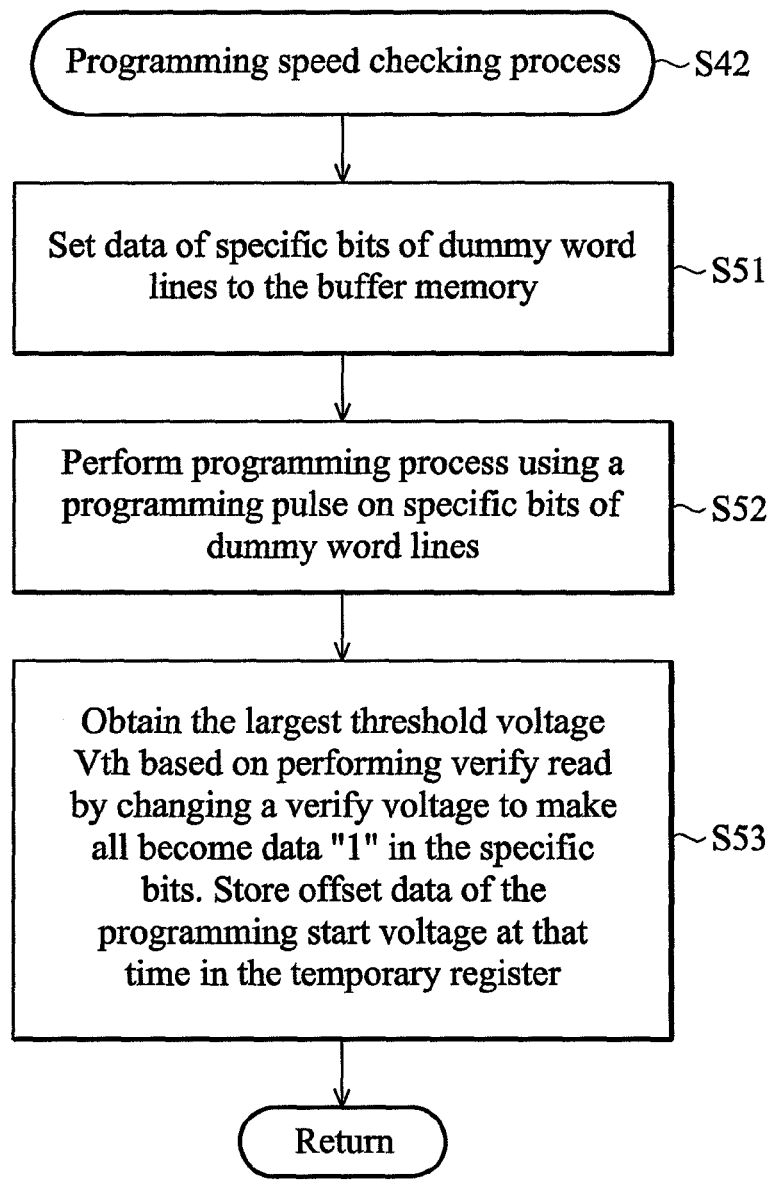
FIG. 18 is a flowchart showing the programming speed checking process (S42) which is a subroutine of FIG. 17.

FIG. 18 is a flowchart showing the programming speed checking process (S42) which is a subroutine of the programming process in FIG. 17. In FIG. 18, first, for specific bits of dummy word lines, data is set to the buffer memory 14 in step S51. Next, in step S52, a programming process using a programming pulse is performed on specific bits of dummy word lines. Then, in step S53, according to performing a verify read by changing a verify voltage to make all becomes data "1" in specific bits, the largest threshold voltage Vth is obtained, and offset data of a programming start voltage at that time is stored in the temporary register, and then the process proceeds back to the original main routine.

Figure 19:
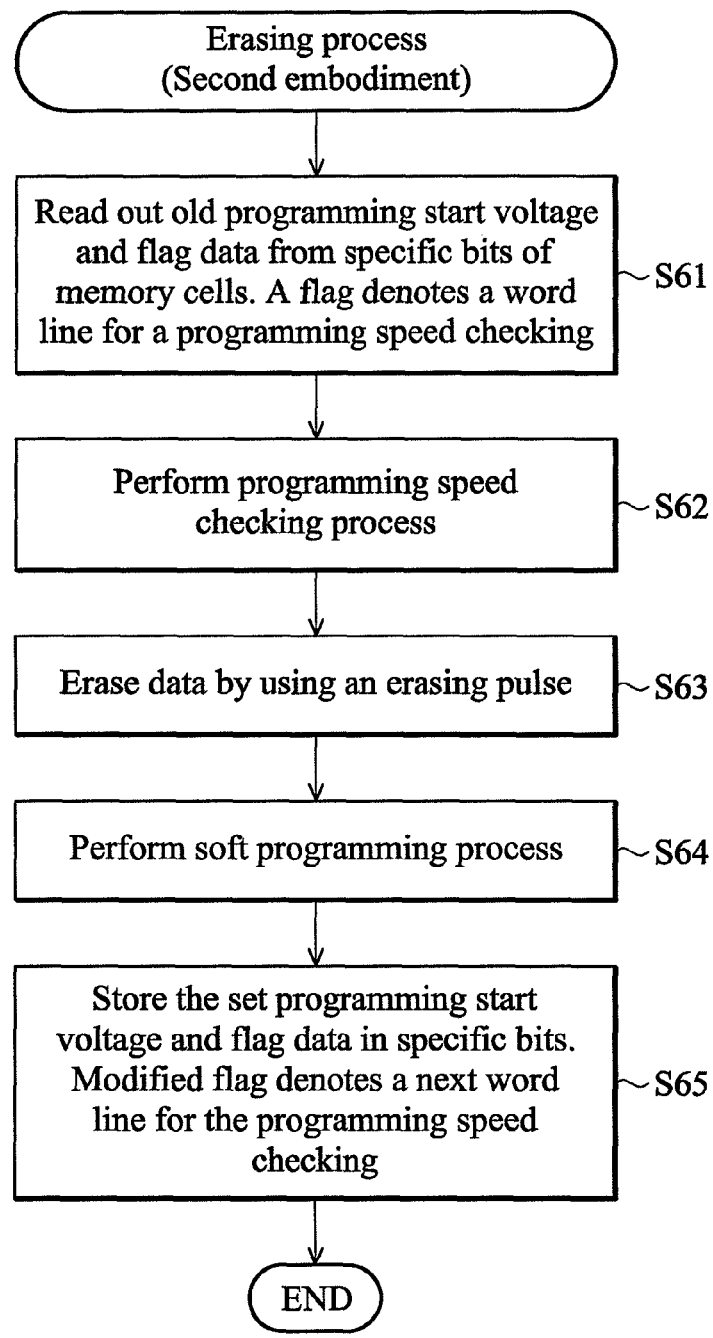
FIG. 19 is a flowchart showing an erasing process according to the second embodiment of the invention.

FIG. 19 is a flowchart showing an erasing process according to a second embodiment of the invention. In FIG. 19, first, an old programming start voltage and flag data are read out from specific bits of memory cells in step S61. Here, a flag denotes a word line for a programming speed checking. Next, the programming speed checking process is performed in step S62. Data is erased by using an erasing pulse in step S63. Then, in step S64, a soft programming process is performed by using a soft programming start voltage based on the programming start voltage set by said programming speed checking or a soft programming start voltage determined by other predetermined ways. Further, in step S65, the programming start voltage and the flag data set as described above are stored in specific bits, and the modified flag denotes a next checking word line for the programming speed checking.

In the programming speed checking process of FIG. 19, in order to reduce extra time for the programming speed checking process, for each erasing process, the programming speed checking process is performed on one specific word line. Thus, one cycle of the programming speed checking process of the word line is equal to a number of cells in a single string. More specifically, user data of word lines is read-out, and the data is set as programming data by obtaining bit "1" (or bits "11"). Therefore, a programming pulse is applied, the largest threshold voltage Vth is detected by performing a verify read as the verify voltage is changed, and the largest threshold voltage Vth is compared with a predicted value to determine a corresponding programming start voltage Vstart(·).

Figure 10:
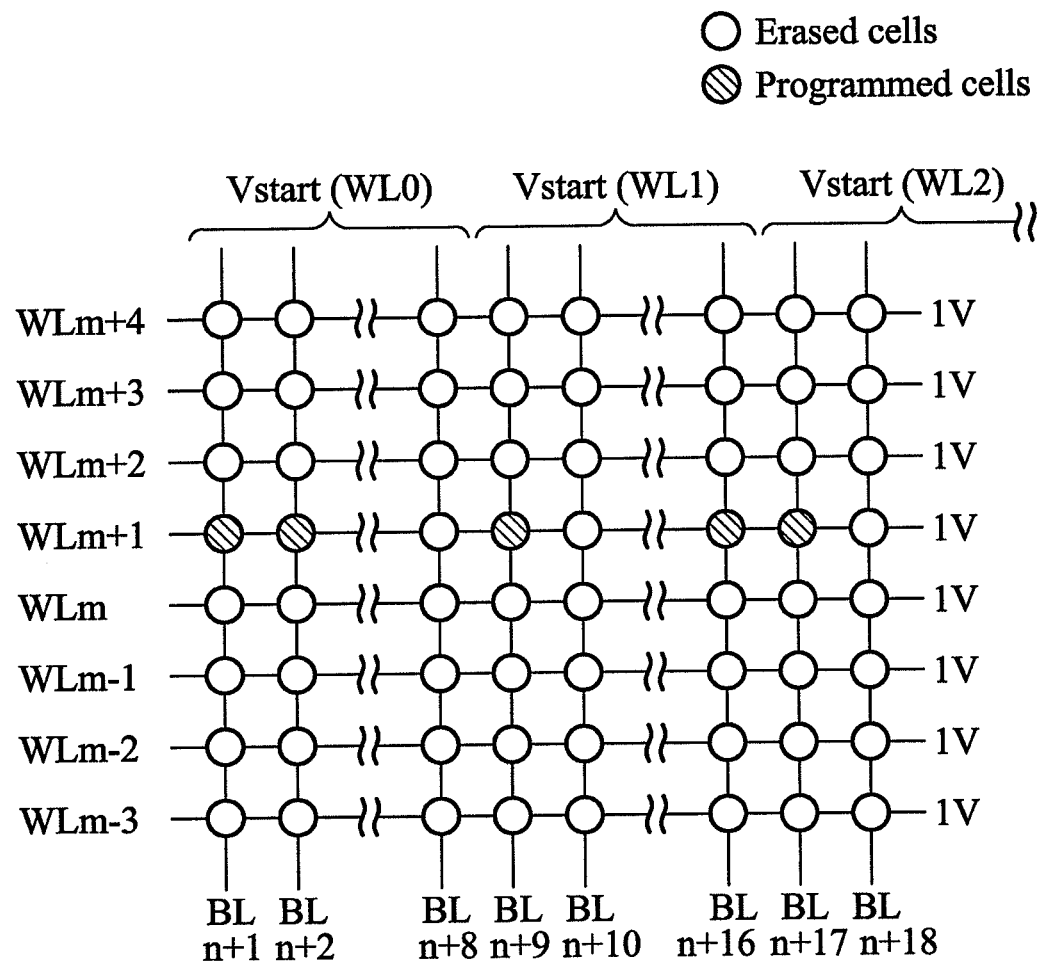
FIG. 10 is a diagram showing a selecting method of word lines for the programming checking process of FIG. 9.

FIG. 10 is a diagram showing a selecting method of word lines according to a modified example for the above programming checking process. The programming checking process is performed while shifting all or some specific word lines in order for every erasing. First, in order to confirm and prepare data storing space of the programming start voltage Vstart, (N+1) bytes are prepared for every word line. Here, N is a number of word lines where the programming speed checking process is performed. The offset value of Vstart(·) is stored in one byte. In step S65 of the erasing process of FIG. 19, for the (N+1) bytes of the word line where the programming speed checking process is performed, a normal SLC programming using a verify voltage Vread =PV is used, wherein the programming start voltage data and the flag data are stored. The steps of the storing process are explained in FIG. 20. Then, in step 61 where the programming start voltage data and the flag data written-in through the storing process are read-out, a reading-out word line voltage Vsp for all word lines (i.e., 1V in FIG. 10) is applied, and data of the programming start voltage Vstart and the flag data that stores a number of a word line which should be measured this time is read out from the word line where data is stored last time. For all (N+1) bytes of one word line with data written, data is read out by one reading-out operation since only the word line is programmed for those specific bits.

Next, the data is decoded by using such as ECC (Error Correcting Code) and so on, and the decoded data is stored in the temporary register. The steps of the reading-out process are explained in FIG. 21. Moreover, word lines for the programming speed check process are set to the word lines of the flag data. Though there's a method for performing speed checking on all word lines, an example of a selecting method of word lines is provided. Since word lines except for the ones on edges are well aligned, WL0,1,2,16,29,30,31 (two edges and central part of a string) are selected. As for WL16, WL16 can cover WL3~28. The selection of word lines is determined according to programming characteristics depending on word lines. Here, for a number of word lines, for example, in the case of storing the programming start voltage data in additional memory cells of a normal word line, a number of extra bits increases, and hence a checking size increases relatively. In addition, in reading-out of the programming start voltage data, verify voltage VpassR=Vread=Vsp is used to read out and verify in one cycle of reading-out, and the flag denotes a next checking word line for the programming speed checking process.

Figure 20:
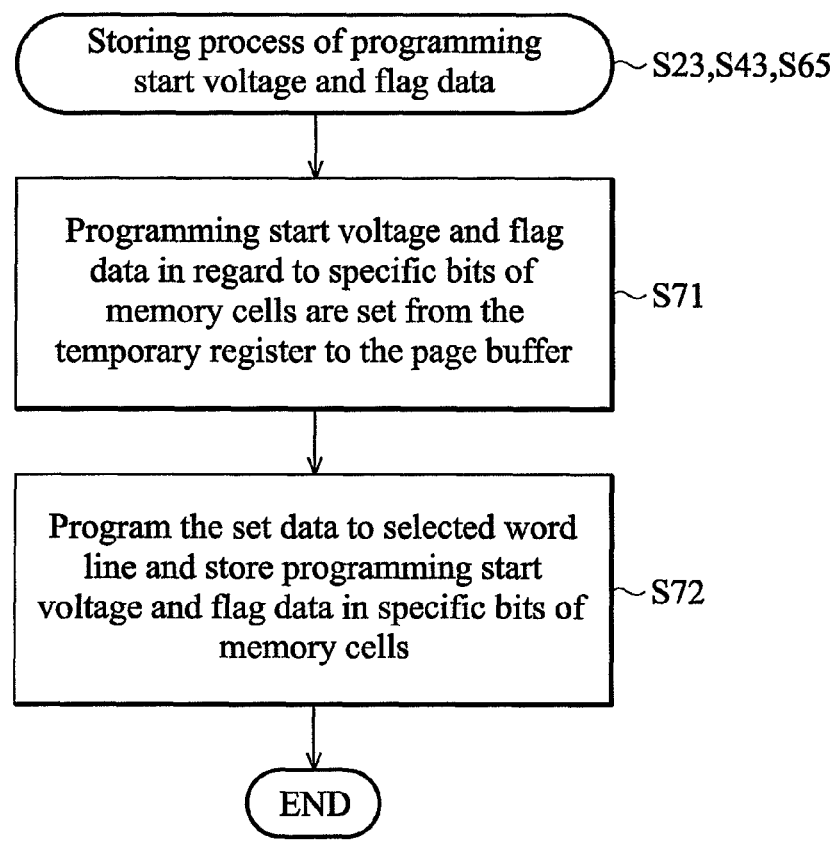
FIG. 20 is a flowchart showing the storing process (S23, S43, S65) of the programming start voltage and the flag data for storing the programming start voltage and the flag data using additional memory cells of the normal word line in the erasing process according to a modified example of the invention.

FIG. 20 is a process (S65) according to a modified example of the invention, showing the steps of the storing process (S23, S43, S65) of the programming start voltage and the flag data in the erasing process for storing the programming start voltage and the flag data using additional memory cells of the normal word line. In FIG. 20, first, for specific bits of memory cells, a programming start voltage and flag data are set from the temporary register to the page buffer 14 in step S71. In step S72, the programming start voltage and the flag data are stored in specific bits of memory cells by programming the set data to the selected word line. As shown in FIG. 10, since cells of word lines other than the selected word line are in the erasing state, a problem that the threshold voltage Vth after write-in is higher than a read pass voltage (VpassR) doesn't exist, and hence the number of writing-in pulse is less than that of normal programming and it can reduce the programming time. More specifically, in normal SLC writing the writing time using 3~4 pulses takes about 200 μs, but the writing time according to the method using only 1~2 pulses can be halved, that is, cut by about 100 μs.

Figure 21:
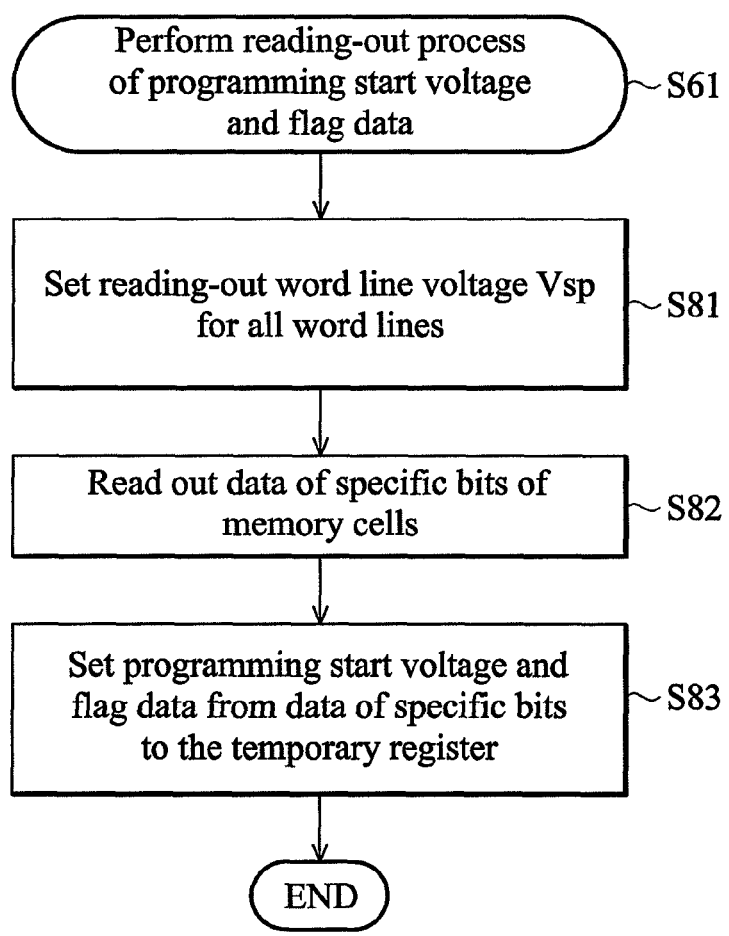
FIG. 21 is a flowchart of the readout of the programming start voltage and the flag data in the programming process for reading-out the programming start voltage and the flag data from additional memory cells of the normal word line in the process (S61) according to a modified example of the invention.

FIG. 21 is a process (S61) according to a modified example of the invention, showing the steps of the readout of the programming start voltage and the flag data in the programming process for reading-out the programming start voltage and the flag data from additional memory cells of the normal word line. In FIG. 21, for all word lines, reading-out word line voltage Vsp is set in step S81. Next, in step S82, data of specific bits of memory cells is read out. In step S83, a programming start voltage and flag data from the data of the specific bits are set to the temporary register. Because it is unknown that the programming start voltage data and the flag data are written in which word line before reading-out the flag data, generally, it is necessary to read-out word lines one by one. However, as shown in FIG. 10, since memory cells other than specific bits of one word line are in the erasing state, reading-out can be performed only once (taking about 20 μs) by applying the reading-out voltage Vsp (1V in FIG. 10) to all word lines. Furthermore, the word line to store the data may be fixed to such as WL16, and hence a number of times of rewriting of each word line can be reduced in every time of shifting. Accordingly, reliability can be improved.

As described above, according to the embodiment, the optimal programming start voltage is determined by performing the programming speed checking process for every block or every word line and write-in of data that changes the programming start voltage is performed, and hence variation of the threshold voltage distribution after programming is minimized and a high-speed rewriting characteristic can be obtained.

In the above description, regarding setting the programming start voltage "for every block or every word line", ideally, it is desirable to perform speed checking and set a start voltage for each of all word lines of all blocks. As mentioned above, write-in speeds of word lines in the middle of a string of memory cells are almost the same. Since this phenomenon is true for a block, the programming speed checking process is performed on a necessary part of the blocks and word lines. For blocks and word lines where the checking process isn't performed, corresponding values of them may be used. As a result, an increase of the erasing process time in the programming speed checking process is lessened.

Moreover, for word lines used to perform the programming speed checking process, in FIG. 18, the dummy word line is used. In this case, a value calculated under initial characteristics or standard characteristics is used for the programming start voltage of each word line, and hence variations are not fully compensated, but variations between blocks are compensated. In addition, there are methods for using user data area of word lines mainly described above and methods for adding additional bits for checking to memory cells.

Moreover, for other methods for determining programming speed check by the largest threshold voltage Vth after write-in, in order to discard unusual data of a fast bit of write-in, a method that uses the second highest threshold voltage Vth may be used. There's no particular problem even for 2~3 bits in a circuit.

Moreover, for bits used in a programming speed checking process, though a method for using user data when normal word lines are used is provided, the invention is not limited to it. In the case of using specific bits of dummy word lines, they can all be used since the writing-in is not performed at all for any cells in those specific bits. As for the constitution of (N+1) bytes and bits of the majority rule, because bits of a word line for programming speed checking process are all in the erasing state, they can also be used. In this way, it is not necessary to use user data.

Moreover, as for memory cells for storing programming start voltage data, though there are additional bits in dummy word lines and normal word lines as in embodiments, for dummy lines, in addition to the normal bit area having no additional bits and additional bit area, there can be a selection between using dummy word lines in a side of the selective gate line SGD and using dummy word lines in a side of the selective gate line SGS. Accordingly, dummy word lines in the side of the selective gate line SGS may be used for storing, and dummy word lines in the side of the selective gate line SGD may be used for a programming speed checking process.

In addition, methods for shifting one word line for every erasing process when the programming speed checking process is performed on one word line are described. Following is described with the embodiment where the programming speed checking process is performed on word lines 0, 1, 2, 16, 29, 30, 31. The invention is not limited to the embodiment. One cycle of speed checking period when the speed checking is performed on all word lines is 32 times. In the case of performing the speed checking on only 7 word lines, except for a method where one corresponding cycle is 7 times, there is still a method in which one cycle is 32 times and word lines 3~15, 17~28 are only counted (only refresh flag bit in the word lines) when word lines 3~28 performing data storing are shifting. It is preferred that the method suppresses degradation of reliability due to rewriting times. Moreover, when the programming speed checking is performed on dummy word lines as shown in FIG. 18 and a number of times of erasing process is counted and stored as flag data, one cycle of the speed checking can be set to a suitable number such as 32 times.

In the above embodiments, though described under the scope of NAND-type flash EEPROM, the invention is not limited to it. The invention can be widely applied to non-volatile semiconductor memory devices, for example, NOR-type flash EEPROM, etc., capable of writing-in data to floating gates thereof.

POSSIBILITY FOR INDUSTRIAL APPLICATION

As described above, according to the non-volatile semiconductor device of the invention and the write-in method thereof, the optimal programming start voltage is determined by performing the programming speed checking process for every block or every word line, writing-in of data that changes the programming start voltage is performed, and hence variation of the threshold voltage distribution after programming is minimized and a high-speed rewriting characteristic can be obtained.

What is claimed is:

1. A non-volatile semiconductor memory device, comprising:
   a non-volatile memory cell array; and
   a control circuit for controlling writing-in to the memory cell array,
   wherein in the stage before an erasing pulse adding in an erasing process where data of written-in memory cells is erased, the control circuit detects a programming speed when writing-in to the memory cell array, determines a programming start voltage corresponding to the programming speed for every block or every word line, stores the determined programming start voltage in the memory cell array and reads-out the programming start voltage from the memory cell array to write-in predetermined data.

2. The non-volatile semiconductor memory device as claimed in claim 1, wherein in the stage before the erasing pulse adding in the erasing process, the control circuit detects the programming speed by using data stored in memory cells of word lines of the memory cell array.

3. The non-volatile semiconductor memory device as claimed in claim 1, wherein in the stage before the erasing pulse adding in the erasing process, the control circuit detects the programming speed by using predetermined memory cells of dummy word lines of the memory cell array.

4. The non-volatile semiconductor memory device as claimed in claim 1, wherein in the stage before the erasing pulse adding in the erasing process, the control circuit detects the programming speed by using predetermined memory cells of word lines of the memory cell array.

5. The non-volatile semiconductor memory device as claimed in claim 1, wherein in the stage after the erasing pulse adding in the erasing process, the control circuit detects the programming speed by using memory cells of dummy word lines of the memory cell array.

6. The non-volatile semiconductor memory device as claimed in claim 1, wherein the control circuit detects the programming speed by using data of only one word line for each erasing process.

7. The non-volatile semiconductor memory device as claimed in claim 6, wherein when the programming speed is detected by using data of only one word line, a position in a memory cell string of the word line used to detect the programming speed is shifted for every erasing process, and a predetermined number of times of erasing process is regarded as one cycle.

8. The non-volatile semiconductor memory device as claimed in claim 1, wherein in a detection of the programming speed, a number of times of erasing is counted for each erasing process, counting information is stored as flag bits in the same way as programming speed data is stored, and when the number of times of erasing reaches a predetermined number, a programming speed checking process is performed and the data is refreshed.

9. The non-volatile semiconductor memory device as claimed in claim 1, wherein the control circuit stores the determined programming start voltage in memory cells of dummy word lines of the memory cell array.

10. The non-volatile semiconductor memory device as claimed in claim 1, wherein the control circuit stores the determined programming start voltage in additional memory cells of word lines of the memory cell array.

11. The non-volatile semiconductor memory device as claimed in claim 10, wherein in order to store the determined programming start voltage, for each word line, a memory area of at least N bytes corresponding to a number N of word lines used to perform a detection of the programming speed is prepared, and the determined programming start voltage is stored in memory cells of word lines used in the detection of the programming speed corresponding to each erasing process.

12. The non-volatile semiconductor memory device as claimed in claim 11, wherein when a word line used to detect the programming speed also serves as data of more than at least one adjacent word line in a string, the determined programming start voltage is not stored in word lines used to perform the detection of the speed but in the word line corresponding to the determined programming start voltage using memory area of N bytes, and shifting is performed for each erasing process.

13. The non-volatile semiconductor memory device as claimed in claim 1, wherein when storing the determined programming start voltage in memory cells of dummy word lines or word lines of the memory cell array, the control circuit performs write-in by adding bits of ECC (Error Correcting Code) to data of the programming start voltage.

14. The non-volatile semiconductor memory device as claimed in claim 13, wherein when bits of the ECC are added, bit cells having more than three bits are used to write-in for one bit of data.

15. The non-volatile semiconductor memory device as claimed in claim 1, wherein the control circuit reads out the stored programming start voltage in one reading-out cycle and uses the read-out programming start voltage to write-in the predetermined data.

16. The non-volatile semiconductor memory device as claimed in claim 1, wherein the control circuit reads out the stored programming start voltage in one reading-out cycle and memorizes all of the read-out programming start voltages in a register, and if a programming process that writes-in the predetermined data is performed in corresponding block, the control circuit reads out a programming start voltage corresponding to the word line from the register to write-in the predetermined data.

17. A write-in method for a non-volatile semiconductor memory device, wherein the non-volatile semiconductor memory device comprises a non-volatile memory cell array and a control circuit for controlling writing-in to the memory cell array, and wherein in the stage before an erasing pulse adding in an erasing process where data of written-in memory cells is erased, the control circuit detects a programming speed when writing-in to the memory cell array, determines a programming start voltage corresponding to the programming speed for every block or every word line, stores the determined programming start voltage in the memory cell array and reads-out the programming start voltage from the memory cell array to write-in predetermined data.

* * * * *